US006991847B2

(12) United States Patent
Padmanabhan et al.

(10) Patent No.: US 6,991,847 B2
(45) Date of Patent: Jan. 31, 2006

(54) LIGHT EMITTING PHOTONIC CRYSTALS

(75) Inventors: Aravind Padmanabhan, Plymouth, MN (US); Ray H. Baughman, Dallas, TX (US); Anvar A. Zakhidov, McKinney, TX (US); Guenadiy Lazarov, Landing, NJ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/068,273

(22) Filed: Feb. 7, 2002

(65) Prior Publication Data

US 2003/0148088 A1 Aug. 7, 2003

(51) Int. Cl.
 *B32B 3/26* (2006.01)
 *C23F 4/04* (2006.01)
(52) U.S. Cl. .............................. 428/316.6; 428/313.9; 428/319.1; 428/543; 428/315.7; 216/56; 216/99; 427/128; 427/249.2; 427/255.12
(58) Field of Classification Search ............. 428/315.5, 428/315.7, 307.3, 319.1, 913, 402, 316.6, 428/316.1, 313.9, 543; 501/86, 133; 63/32; 427/128, 249.2, 255.12; 216/56, 99
See application file for complete search history.

(56) References Cited

U.S. PATENT DOCUMENTS

| | | | | | |
|---|---|---|---|---|---|
| 5,617,445 | A | * | 4/1997 | Jewell ........................ | 372/96 |
| 6,052,213 | A | | 4/2000 | Burt et al. .................. | 359/237 |
| 6,064,506 | A | * | 5/2000 | Koops ........................ | 359/237 |
| 6,093,941 | A | * | 7/2000 | Russell et al. .............. | 257/103 |
| 6,251,469 | B1 | | 6/2001 | Papathomas et al. ......... | 216/56 |
| 6,456,416 | B1 | * | 9/2002 | Ichimura et al. ........... | 359/241 |
| 6,462,356 | B1 | * | 10/2002 | Koyama et al. .............. | 257/79 |
| 6,589,883 | B2 | * | 7/2003 | Gole et al. .................. | 438/753 |

FOREIGN PATENT DOCUMENTS

WO  WO 200021905 A1 * 4/2000

OTHER PUBLICATIONS

"Topical Review: The Future of MEMS in Telecommunications Networks", James A. Walker, J. Micromech. Microeng. 10 (2000) R1-R7. Printed in the UK.
Bertone, J., et al., *Phys. Rev. Lett.* 83, 300-303 (1999); "Thickness Dependence of the Optical Properties of Ordered Silica-Air and Air-Polymer Photonic Crystals".
Blanco, A., et al., *Nature* 405, 437-440 (2000); "Large-Scale Synthesis of a Silicon Photonic Crystal With a Complete Three-Dimensional Bandgap Near 1.5 Micrometres".
Canham, L.T., *Appl. Phys. Lett.* 57 (1990), 1046-1048; "Silicon Quantum Wire Array Fabrication by Electro-Chemical and Chemical Dissolution of Wafers".
Chomski, E., et al., *Chem. Vap. Dep.* 2, 8-13 (1996); "New Forms of Luminescent Silicon: Silicon-Silica Composite Mesostructures".
Dag O., et al., *Adv. Mater.* 11, 474-480 (1999); "Photoluminescent Silicon Clusters in Oriented Hexagonal Mesoporous Silica Film".
John, *Phys. Rev. Lett.* 58, 2486-2489 (1987); "Strong Localization of Photons in Certain Disordered Dielectric Superlattices".
Lin, S. Y., et al., *IEEE J. Lightware Technol.* 17, 1944-1947 (1999); "A Three-Dimensional Optical Photonic Crystal".
Noda, S., et al., *IEEE J. Lightware Technol.* 17, 1948-1955 (1999); "Alignment and Stacking of Semi-Conductor Photonic Bandgaps by Wafer-Fusion".
Uhlir, Jr., A., *Bell System Tech. J.*, 35, (1956), 333-347; "Electrolytic Shaping of Germanium and Silicon".
Yablonovitch, *Phys. Rev. Lett.* 58, 2059-2062 (1987) "Inhibited Spontaneous Emission in Solid-State Physics and Electronics".

* cited by examiner

*Primary Examiner*—Hai Vo
(74) *Attorney, Agent, or Firm*—Roberts & Roberts, L.L.P.

(57) ABSTRACT

The invention relates to processes for the synthesis of 2-D and 3-D periodic porous silicon structures and composites with improved properties having the advantages of porous silicon and photonic bandgap materials. Photonic crystals comprise a two dimensionally periodic or three dimensionally periodic microporous structural matrix of interconnecting, crystallographically oriented, monodispersed members having voids between adjacent members, and said members additionally having randomly nanoporous surface porosity. The silicon nanofoam material shows enhanced and spectrally controlled/tunable photoluminescence and electroluminesce and finds use as transparent electrodes, high-lumonosity light emitting diodes (LEDs), wavelength division multiplexors, high-active-area catalyst supports, photonic bandgap lasers, silicon-based UV detectors, displays, gas sensors, and the like.

39 Claims, 4 Drawing Sheets

LIGHT EMITTING PHOTONIC CRYSTALS

BACKGROUND OF THE INVENTION

1. Field of the Invention

The invention relates to 2 and 3-dimensionally periodic porous structures and composites with improved properties incorporating the advantages of porous silicon and photonic bandgap materials. The inventive material, referred to as silicon nanofoam, shows enhanced and spectrally controlled, tunable photoluminescence and electroluminesce and finds use as high-luminosity light emitting diodes (LEDs), wavelength division multiplexors, high-active-area catalyst supports, photonic bandgap lasers, silicon-based UV detectors, displays, gas sensors, and the like.

2. Description of Related Art

Photonic bandgap materials, also referred to as photonic crystals, and the possibility to utilize them to manipulate light was introduced first by Yablonovitch, Phys. Rev. Lett. 58, 2059–2062 (1987) "Inhibited spontaneous emission in solid-state physics and electronics" and John; Phys. Rev. Lett. 58, 2486–2489 (1987); "Strong localization of photons in certain disordered dielectric superlattices". The refractive index in photonic bandgap materials is periodically modulated creating a 3-D diffraction grating for electromagnetic radiation. Similar to electron interaction with the atomic potential in crystalline solids, photons interact with a spatially modulated dielectric medium, resulting in a series of exciting phenomena, like reflection stop bands, due to Bragg diffraction. If the contrast between alternating areas of high and low refractive index is large enough, the stop bands may overlap forming a forbidden frequency range, referred to as a photonic bandgap, where electromagnetic waves are not allowed to propagate in any direction inside the material. Therefore the photonic crystals can be viewed as photonic analogs to semiconductors with the electrons substituted by photons as information carriers. This analogy is related to the inhibition of spontaneous emission and light localization. Porous Silicon was first been produced in 1956; see Uhlir A., Bell System Tech. J., 35, (1956), 333. Recently it has become one of the most attractive nanomaterials because of its room-temperature efficient photoluminescence; see L. T. Canham, Appl. Phys. Lett. 57 (1990) 1046. The availability of luminescent silicon would allow creating all-silicon optoelectronic systems compatible with almost all products of the microelectronic industry. The current porous silicon LEDs use only a small fraction of the material due to power dissipation losses, limited active surface area, and non-uniform pore size distribution.

Photoluminescence in porous silicon is explained with quantum confinement of charges and excitons in the nanostructures created by the electrochemical etching of bulk silicon. Periodic photonic crystals are emerging as a basis for optoelectronics due to confinement and localization of photons. Silicon photonic crystals are among the best photonic crystals, showing wide photonic band gap due to high refractive index contrast. The first demonstrations of photonic bandgap in the microwave and infrared bands have been performed in bulky silicon photonic crystals. It has now been found that a new material, a silicon nanofoam, couples the advantages of the porous silicon and photonic crystals. Such photonic crystals are actively emitting photonic materials, with the nanoporosity being responsible for the emission of light, and the geometry (periodicity and defects) of the photonic bandgap structure controlling the propagation of the emitted photons. The existing porous silica devices however suffer from the problems of non-uniform pore size distribution and limited active surface area. These problems result in lowered photoluminescence intensity and considerable variability in this intensity from device to device.

Hexagonally packed arrays of silica (artificial opals) or latex microspheres (colloidal crystals) provide systems for observing the properties of photonic crystals. In order to achieve a high refractive index contrast, face-centered cubic (f.c.c.) ordered arrays may be used as templates to create inverse opal structures, comprising spherical cavities in a metallic or dielectric medium. This may be done by sintering of the template to form narrow "necks" between the spheres, synthesis or infiltration of another material inside the void space of the template, and removal of the f.c.c. matrix by chemical etching of the opal or by burning of the colloidal crystal. As a result one obtains a replica of the template, referred to as inverse opal. Inverse opals have been fabricated from metals, oxides, various forms of carbon, polymers, and semiconductors. The structures have applications as photonic crystals for the infrared region.

Silicon is a very attractive material for fabrication of infrared photonic crystals because it is transparent in the frequency range of interest for optical communications (1.25 $\mu$m–1.55 $\mu$m) and has refractive index of approximately 3.45 that is larger than the critical value of 2.8 required for opening of a photonic bandgap in a f.c.c. lattice of spherical cavities. Lin, S. Y. et al., IEEE J. Lightware Technol. 17, 1944–1947 (1999); "Three-dimensional optical photonic crystal" and Noda, S. et al., IEEE J. Lightware Technol. 17, 1948–1955 (1999) "A three-dimensional optical photonic crystal" have reported the fabrication of silicon optical PCs by lithographic techniques. However, these methods are complex and expensive and the obtained structures consist of only a few layers. Bertone, J., et al, Phys. Rev. Lett. 83, 300–33 (1999) "Thickness dependence of the optical properties of ordered silica-air and air-polymer photonic crystals" have shown that the photonic properties depend on the thickness of the structure with the stop bands becoming more pronounced as the number of layers increases. Blanco, A., et al, Nature 405, 437–439 (2000) "Large-scale synthesis of a silicon photonic crystal with a complete three-dimensional bandgap near 1.5 micrometers" reported the first demonstration of an infrared silicon photonic crystal with photonic bandgap centered at 1.46 $\mu$m. Chomski, E., et al., Chem. Vap. Dep. 2, 8–13 (1996) "New forms of luminescent silicon: silicon-silica composite mesostructures" and Dag, O., et al., Adv. Mater. 11, 474–480 (1999) "Photoluminescent silicon clusters in oriented hexagonal mesoporous silica film" have reported grown silicon inside the voids of bulk opals with particle size of 1.2 $\mu$m by chemical vapor deposition (CVD) using disilane ($Si_2H_6$) gas as a precursor. The best photonic properties have been achieved by surface infiltration, i.e. by forming thin silicon films around silica balls. The inverse opal obtained after removal of the opal template consists of hexagonally packed silicon spherical shells.

It has now been found that an improvement may be achieved by optimization of the CVD-based silicon deposition process. A low-pressure chemical vapor deposition (LPCVD) procedure allows the fabrication of both 2-D and 3-D silicon inverse opal photonic crystals with variable filling factor and size of the spherical pores on a nanometer scale. Thus, the range of tunability of the photonic properties is extended from the infrared to visible light frequencies. This invention thus provides a silicon inverse opal with photonic properties in the range of visible light which may form high-luminosity silicon nanofoam-based LEDs. The nanoporosity is responsible for the emission of light, and the periodic macroporosity of the photonic crystal structure controls the propagation of the emitted photons. Compared to conventional porous silicon, the inventive material has much larger active surface area since the whole volume of the material is used in the process for creating nanoporosity. The nanoporosity is created on the device after the periodic macroporosity has been created. This is unlike the process for the formation of conventional porous silicon via various chemical etching processes where only the surface of the bulk silicon is exposed to an etchant. Thus, the photoluminescence in these silicon nanofoams is enhanced by about ten-fold over conventional porous silicon. In addition, by tuning the position of the photonic band gap of the photonic crystal structure, even further photoluminescence enhancement at particular wavelength bands of the photoluminescence spectrum may be achieved due to nonlinear effects at the photonic band gap edges. The invention provides very low density nanofoams, which are highly periodic (photon confinement in photonic bandgap) and have nanoscale porosity. The invention combines the advantages of porous silicon and silicon-based photonic crystals and can be used to produce light emitting photonic crystals that exhibit two-levels of porosity: periodic microporosity in the silicon inverse opal backbone and random nanoporosity obtained by making the silicon backbone porous by chemical or electrochemical etching.

SUMMARY OF INVENTION

The invention provides a photonic crystal which comprises a two dimensionally periodic or three dimensionally periodic microporous structural matrix of interconnecting, crystallographically oriented, monodispersed members having voids between adjacent members, and said members additionally having randomly nanoporous surface porosity.

The invention also provides a process for forming a photonic crystal which comprises forming a two dimensionally periodic or three dimensionally periodic microporous structural matrix of interconnecting, crystallographically oriented, monodispersed members having voids between adjacent members, and then providing surfaces of said members with randomly nanoporous surface porosity.

The invention further provides a process for the formation of a three-dimensionally-periodic porous structure, comprising the steps of (a) crystallizing spheres of material A into a first structure having three-dimensional periodicity, and voids between spheres, wherein the material A is mechanically and thermally stable to at least about 600° C., (b) treating this first structure so that necks are formed between the spheres of material A, (c) infiltrating said first structure with material B to form a A-B composite structure, (d) removing material A from said A-B composite structure to form a second structure comprising material B; and then, e) providing surface of said second structure with randomly nanoporous surface porosity.

The invention still further provides a process for preparing a three-dimensionally-periodic, porous, dielectric, photonic crystalline structure which comprises forming an array of microscopic spheres on a smooth substrate into a face centered cubic structure having spaces between adjacent spheres, which spheres have an average diameter not exceeding about 1000 nm; sintering the spheres under conditions sufficient to attach adjacent spheres to one another by an intermediate neck; forming a solid silicon structure in the spaces between adjacent spheres by infiltrating silane gas into the spaces in a low pressure chemical vapor deposition process; wherein the silane gas is infiltrated into the spaces at a temperature of from about 450° C. to about 600 ° C., at a pressure of from about 100 mtorr to about 600 mtorr and at a flow rate of from about 50 sccm/min. to about 150 sccm/min.; removing the spheres; and then providing surface of said structure with randomly nanoporous surface porosity.

Moreover the invention provides a photonic device which comprises a photonic crystal which comprises a two dimensionally periodic or three dimensionally periodic microporous structural matrix of interconnecting, crystallographically oriented, monodispersed members having voids between adjacent members, and said members additionally having randomly nanoporous surface porosity; and an electrically conductive, optically transparent layer positioned on opposite surfaces of the photonic crystal.

DETAILED DESCRIPTION OF THE INVENTION

Figure 1:
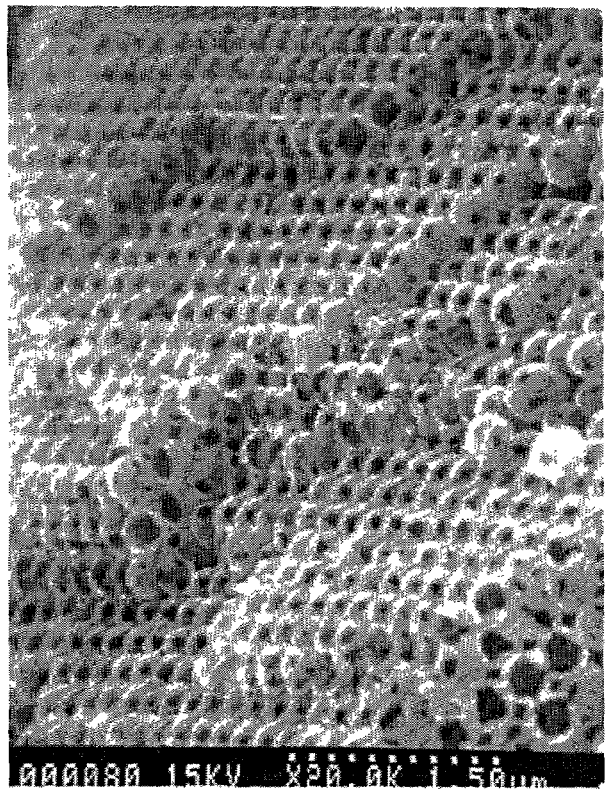
FIG. 1 shows a scanning electron microscope (SEM) photograph of a silicon inverse opal. The silicon shell has thick walls approximately 30 nm thick.

The invention provides a photonic crystal which comprises a two dimensionally periodic or three dimensionally periodic microporous structural matrix of interconnecting, crystallographically oriented, monodispersed members having voids between adjacent members, and said members additionally having randomly nanoporous surface porosity. The members may take any shape, however preferred are interconnected layers of spheres, inverse spheres, and interdigitated log-like or plank-like panels which alternately overlap at an angle to one another, such as a 90° angle. Spheres and inverse spheres are more preferred.

The first step in the production of the photonic crystals of the invention is to produce a periodic, porous, dielectric, photonic crystalline structure, preferably on a substrate. In one embodiment, photonic crystals are composed of members which comprise interconnected spheres, in particular wherein the average sphere diameter does not exceed about 1000 nm. In another embodiment, the photonic crystal is composed of members which comprise surfaces or interfaces that are inverse replicas of the surfaces of a monodispersed sphere array, wherein necks exists between neighboring spheres in the sphere array, and the average sphere diameter does not exceed about 1000 nm.

When the members comprise interconnected spheres, one first assembles nearly monodispersed spheres of a material such as $SiO_2$ spheres into an "opal-like" lattice. The term opal, opal-like, opal template designates structures having a packing or spheres that is similar to the well-known packing of $SiO_2$ spheres in natural gem opal. In a preferred embodiment, such assembly is created by a sedimentation process whose rate can be enhanced by centrifugation from a colloidal solution of the spheres. The spheres are partially joined together so that finite diameter necks connect neighboring spheres. In a preferred embodiment, this partial joining of neighboring spheres is done by sintering at high temperatures, for example from about 650° C. to about 900° C. for $SiO_2$ spheres.

When the elements are to be inverse spheres, the partially sintered porous opal crystal may used as a template for obtaining a three-dimensionally periodic assembly of a second material, which is infiltrated into the opal. This second material can be infiltrated into the opal so as to substantially fill the void space of the opal. Next the opal material may be dissolved or otherwise removed to obtain a hollow structure that is an inverse replica of the original opal structure.

The primary opal template is the initially formed periodic structure that has the desired lattice periodicity. In the most preferred embodiments, this primary opal template will be a porous lattice of $SiO_2$ spheres that are packed into a face-centered-cubic (fcc) lattice. These and structurally related derivative structures having a structure analogous to that of natural opal will be referred to as opals or opal templates independent of whether or not the spheres in the parent template are of $SiO_2$. Also, the structures obtained by partial or complete filling of the opal void space with a second material, followed by removal of the original opal lattice material, will be called inverse opals, independent of the chemical composition of the primary opal template.

The step of generating an extended interface between spheres is important for producing inverse opals if the infiltrated material completely covers the internal surface of the spheres in the primary opal template. This extended interface between spheres is most preferably generated by heating the opal-like sphere array to a temperature that is sufficiently high that sintering creates an intersphere neck between neighboring spheres. The temperature and times required for this sintering will depend on the composition of the spheres, with shorter times and higher temperatures typically being equivalent to longer times at lower temperatures. Such sintering process should preferably be accomplished at below the temperature at which the spheres become sufficiently fluid that a nearly spherical shape cannot be maintained. To illustrate this approach, in one embodiment the spheres are $SiO_2$ spheres in which the required interface is created by sintering. Such sintering is normally achieved by a two step annealing process. The first step is a low temperature anneal at typically 100–120° C. for 2–3 days to eliminate excess water, and the second step is typically a high temperature anneal at 650–900° C. for several hours, resulting in Si—O—Si linkages between the silica of adjacent spheres. The flow of silica between spheres at high temperatures creates the necks of finite diameter (up to 125 nm for 250 nm spheres) without substantially changing the spherical shape of each sphere. While sintering provides the inter-sphere interface through which the $SiO_2$ can be removed after infiltration, too much sintering prohibits infiltration by closing the passages between the voids in the original fcc silica lattice. The infiltration and extraction processes can proceed through these narrow channels over millimeter opal thickness, thereby replicating periodic structural features of the original opal crystals. The sphere material is preferably mechanically and thermally stable to at least about 300° C., more preferably at least about 500° C., and most preferably at least about 800° C. By mechanical and thermal stability to these temperatures it is meant that these particles have sufficient stability at these temperature to largely maintain the structural regularity of opals based on these spheres. By mechanical and thermal stability it is further meant that degradation processes occurring at this temperature leaves a stable product which will not disappear by further gas evolution or fluidization at the specified temperature. The sphere material is preferably monodispersed spheres having an average sphere diameter which does not exceed about 1000 nm. Preferably the average sphere diameter is in the range of from about 100 nm to about 1000 nm. These spheres may be composed of materials which can be virtually any organic or inorganic composition that satisfies the above stability conditions. Examples are ceramics, salts, metals, carbon phases, and high thermal stability organic polymers.

Non-limiting examples of useful sphere types that are commercially available include poly(tetrafluoroethylene), poly(tetrafluoroethylene-propylene), poly(vinyl chloride), polystyrene, phenolics, graphitized carbon, colloidal gold, glass spheres, hollow glass spheres, and silica. The most preferred spheres are $SiO_2$. For the purposes of this invention the term sphere includes near spherical particles that pack similarly to spheres, such as oblong or icosohedral particles. Other useful sphere members comprise a semiconductor material, silicon, polysilicon, p-type or n-type doped silicon and p-type or n-type doped polysilicon. The spheres may be surface coated with a layer of a metal such as aluminum, gold, silver, platinum, or combinations thereof. The metal coating thickness may be from about 0.1 nm to about 50 nm.

Various methods well known in the art can be used to assemble the spheres of the opal template. The most preferred method is by the slow sedimentation of a colloidal suspension of nearly monodispersed spheres. These spheres preferably differ in radii by no more than a factor of 1.05. This crystallization can be optionally accelerated by the application of an electric or magnetic field or field gradient, or by using a centrifuge. Also, in order to accelerate the crystallization process, one can optionally use a low viscosity fluid as the suspension medium for the colloidal particles, such as supercritical water or carbon dioxide. Sphere assembly can optionally be accomplished by the mechanical vibration of either a dry or wet assembly of spheres. The growth of $SiO_2$ opals can be conveniently accomplished by slow crystallization of the monodispersed aqueous colloid by sedimentation. The most preferred structure for the primary opal template is face-centered arrangement of monodispersed spheres. Other preferred structures for the primary opal template are hexagonal-close-packed arrangements of monodispersed spheres, body-centered-cubic arrangements of monodispersed spheres, crystalline structures comprising mixtures of rods and spheres having monodispersed diameters, and crystalline arrangements of two or more sphere types. Preferably from about 20 to about 100 layers of spheres are formed.

The spheres are typically assembled on the surface of a smooth, flat substrate. Useful substrate materials non-exclusively include glass, quartz, borosilicate glass, silicon, sapphire and combinations thereof. Preferably the substrate comprises sapphire. Most preferably the substrate is sapphire which is substantially flat, hydrophilic, HF resistant, optically transparent, and resistant to heat elongation in any direction at temperatures of up to about 800° C.

The spheres are then sintered. Sintering the spheres may be done under conditions sufficient to attach adjacent spheres to one another by an intermediate neck. Such may be conducted at a temperature of from about 650° C. to about 900° C., preferably from about 600° C. to about 800° C., and preferably in an inert gas atmosphere such as nitrogen for from about 2 hours to about 20 hours. Mechanical strength measurements indicate when the sintering is sufficient for the development of the required inter-sphere interfaces. Typical resulting mechanical properties in compression for polycrystalline centimeter-size cubes of sintered 250 nm diameter opals spheres are a modulus of 24 GPa, an ultimate strength of 107 MPa, and a failure strain of 0.8%. The absence of over-sintering, leading to void interconnect closure, may be insured by observing the transformation from the initial chalk-like appearance to a transparent, opalescent appearance when the opal is submersed in a liquid having about the same refractive index as the $SiO_2$ spheres.

When forming an inverse opal structure, one then forms a solid structure in the spaces between adjacent spheres by infiltrating a suitable material into the spaces. The selection of the infiltration material depends on the application need. For example, these materials can include optical materials such as diamond, superconductors, redox materials such as conducting organic polymers, piezoelectrics, metals, semimetals, semiconductors, elastomers, polymers, thermoelectrics, ferroelectrics, electrostrictive materials, magnetoresistive, ferromagnetic materials and combinations thereof. Examples are diblock and triblock polymers involving linkages of either polystyrene, polybutadiene, polyisoprene, poly(methylacrylate), poly(propylene oxide), poly(dimethylsiloxane), or polyethylene oxide. Preferred materials are semiconductor materials and the most preferred material comprises silicon or polysilicon (doped or undoped). Other materials comprises carbon, chalcogenide glasses, tin, lead or combinations thereof. In another embodiment, a three-dimensionally-periodic porous structure may be produced by crystallizing spheres of material A into a first structure having three-dimensional periodicity, and voids between spheres, wherein the material A is mechanically and thermally stable to at least about 600° C., treating this first structure so that necks are formed between the spheres of material A, infiltrating the first structure with material B to form a A-B composite structure, removing material A from said A-B composite structure to form a second structure comprising material B; and then providing surface of said second structure with randomly nanoporous surface porosity.

Various methods can be used to obtain infiltration, such as melt or solution infiltration, chemical vapor deposition (CVD) (including variants thereof like plasma-enhanced CVD and low pressure chemical vapor deposition), gas phase condensation, electrochemical deposition, and reaction of an infiltrated fluid. Examples of these processes include the deposition of a conducting polymer into the void volume of a porous opal by polymerization from a solution of the corresponding monomer and a suitable oxidant, by electrochemical polymerization, by vapor phase infiltration (involving de-polymerization and re-polymerization), by melt phase infiltration, or by deposition from a solution of the conducting polymer. A preferred method for forming a solid silicon structure in the spaces between adjacent spheres is by infiltrating silane gas into the spaces in a low pressure chemical vapor deposition process; wherein the silane gas is infiltrated into the spaces at a temperature of from about 450° C. to about 600° C., at a pressure of from about 100 mtorr to about 600 mtorr and at a flow rate of from about 50 sccm/min. to about 150 sccm/min. This is conducted for from about 4 hours to about 36 hours. The process is conducted such that the solid silicon structure fills from about 10% to about 100% of the total volume between the spheres, more preferably from about 25% to about 30% of the total volume between the spheres. One useful doped polysilicon production technique uses silane ($SiH_4$) and a fixed amount of phosphine ($PH_3$) to deposit doped polysilicon films at a process pressure and temperature of 375 mTorr and 615° C. respectively.

Figure 2:
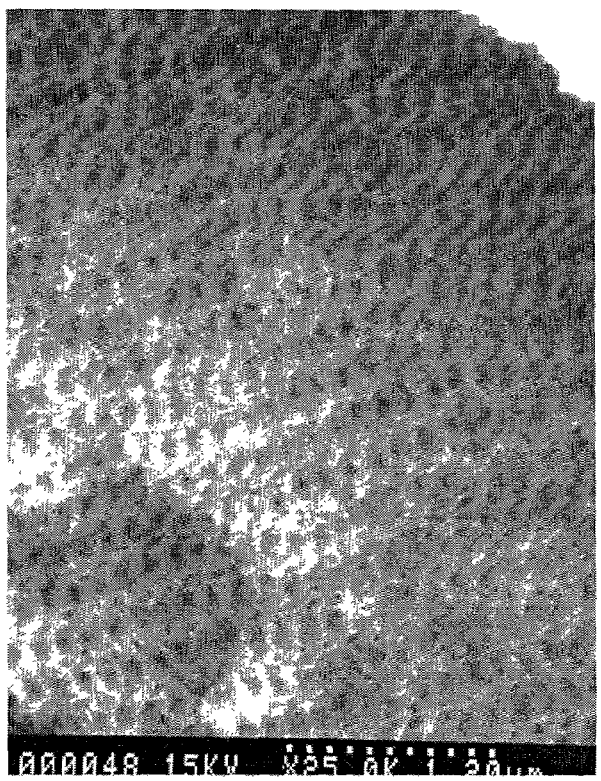
FIG. 2 shows a scanning electron microscope (SEM) photograph of a silicon inverse opal. The silicon shell has thin walls approximately 3 nm thick.
Figure 3:
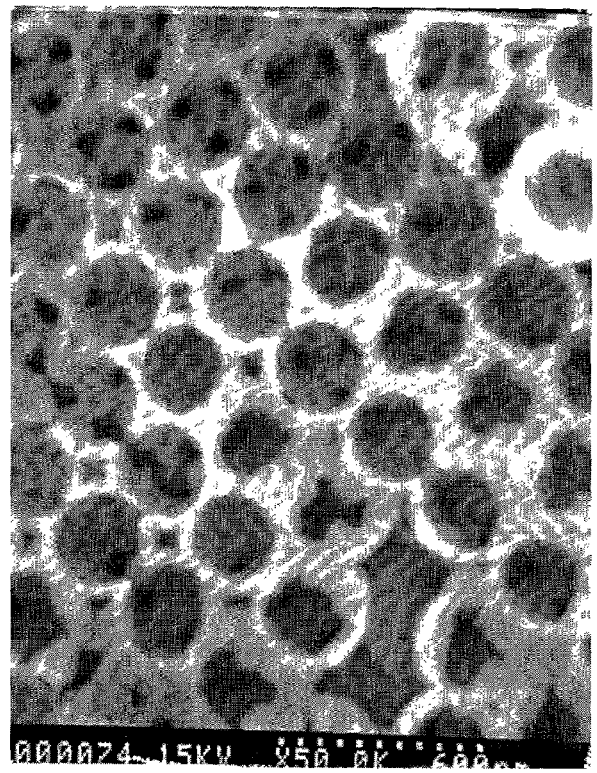
FIG. 3 shows a scanning electron microscope (SEM) photograph of a silicon inverse opal at a {111} cross section of a face-centered-cubic (fcc) lattice.
Figure 4:
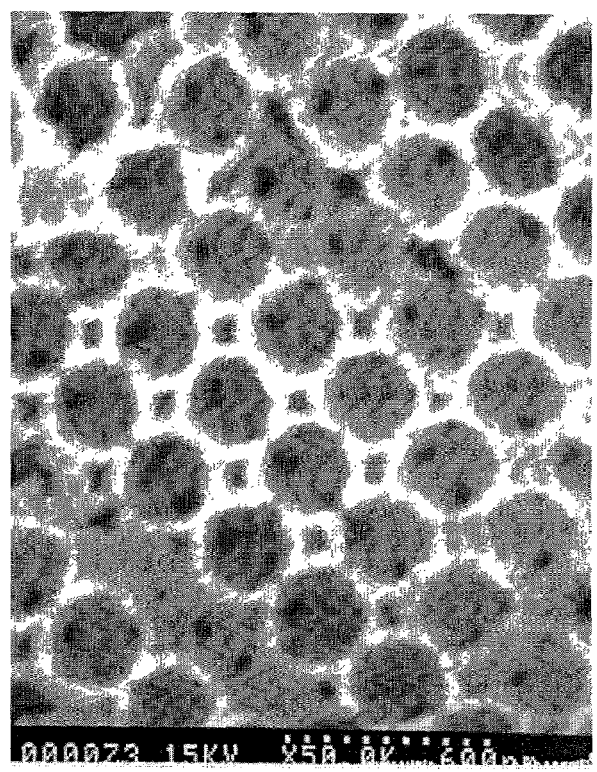
FIG. 4 shows a scanning electron microscope (SEM) photograph of a silicon inverse opal at a {100} cross section of a face-centered-cubic (fcc) lattice.

The spheres are then removed by extraction. Chemical reaction, melt phase de-infiltration, solution extraction, super-critical fluid extraction, and electrochemical dissolution are useful methods for the extraction processes of this invention. Which method is utilized depends naturally upon the nature of the material being extracted and the material that should be unaffected by such extraction processes. The choice of the most suitable extraction process is conveniently determined by using the known characteristics of the materials in question, or by experiments that measure the rate at which components of opal derived structures are removed by particular chemicals. For example, the $SiO_2$ spheres of the $SiO_2$ opals can be extracted (or, if desired, partially extracted) by using either an acid (such as aqueous HF) or a base (such as alcoholic, aqueous or non-aqueous sodium hydroxide or potassium hydroxide). Such extraction can be either at ambient or lower temperatures, or at elevated temperatures to accelerate the extraction process. Such extraction processes can be accomplished at various steps in the creation of complex three-dimensionally periodic structures. For example, it has been found that extraction with aqueous KOH can be used to modify the structure of the original opal in useful ways. Limited exposure to the base preferentially etches the sphere regions that are removed from the inter-connect region for sintered $SiO_2$ opal—resulting in a template structure with an enhanced void volume, and dumb-bell-like interconnections between neighboring spheres. Such a structure with rod-like struts between spheres has been sought for the purpose of making photonic bandgap crystals. Most preferably, the removal of the sphere material is by treatment with either an acid, a base, or a solvating or reacting chemical at a temperature of below 200° C. Other less preferred methods can also be used for the extraction processes (or partial extraction processes), such as gas phase removal by sublimation, thermal degradation, and plasma reaction. Most preferably the spheres are removed by dissolving with a hydrogen fluoride vapor, a buffered oxide etch, or a plasma based dry etch. The inverse opals synthesized by the present processes are ideal for optical demultiplexer applications, since the diffraction efficiency of the array is enhanced if the low refractive index phase occupies a much larger volume fraction than the high refractive index phase. For inverse opals made by the processes of this invention, an infiltrated material has filled the void space and the spherical particles have been extracted leaving air spheres. Hence, the low refractive index phase (i.e., the air) is now the majority phase, which maximizes diffraction efficiency. Three dimensionally periodic structures and techniques for their preparation are more fully described in U.S. Pat. No. 6,261,469 and U.S. patent application Ser. No. 10/006,520 filed Dec. 3, 2001, which are incorporated herein by reference. By the choice of conditions and materials, the configuration of the inverse opals can be controlled. For example, FIG. 1 shows a scanning electron microscope (SEM) photograph of a silicon inverse opal wherein the silicon shell thickness has thick walls while FIG. 2 shows a silicon inverse opal shell having thin walls. FIG. 3 shows an SEM photograph of silicon inverse opal at a {111} cross section of a face-centered-cubic (fcc) lattice while FIG. 4 shows an SEM photograph of silicon inverse opal at a {100} cross section of a face-centered-cubic (fcc) lattice.

The processing steps up to this point produce a two dimensionally periodic or three dimensionally periodic microporous structure. From this point, the microporous structure is then provided with randomly nanoporous surface porosity to produce the inventive nanofoam, that couples the advantages of porous silicon and photonic bandgap materials. The nanofoam has periodic close packed hollow members with enormous surface area and a hierarchical pore structure. In addition, they will be porous at nano-scale level, resulting in photo- and electro-luminescence.

This is accomplished by etching the micropore members to provide a superimposed nanoporous surface porosity comprising nanopores having an average pore diameter which is less than about 10 nm. The members are provided with randomly nanoporous surface porosity by a wet etch or gas phase etch. For example, the members may be provided with randomly nanoporous surface porosity by chemical etching, chemical vapor etching, electrochemical etching or chemical stain etching.

Figure 6:
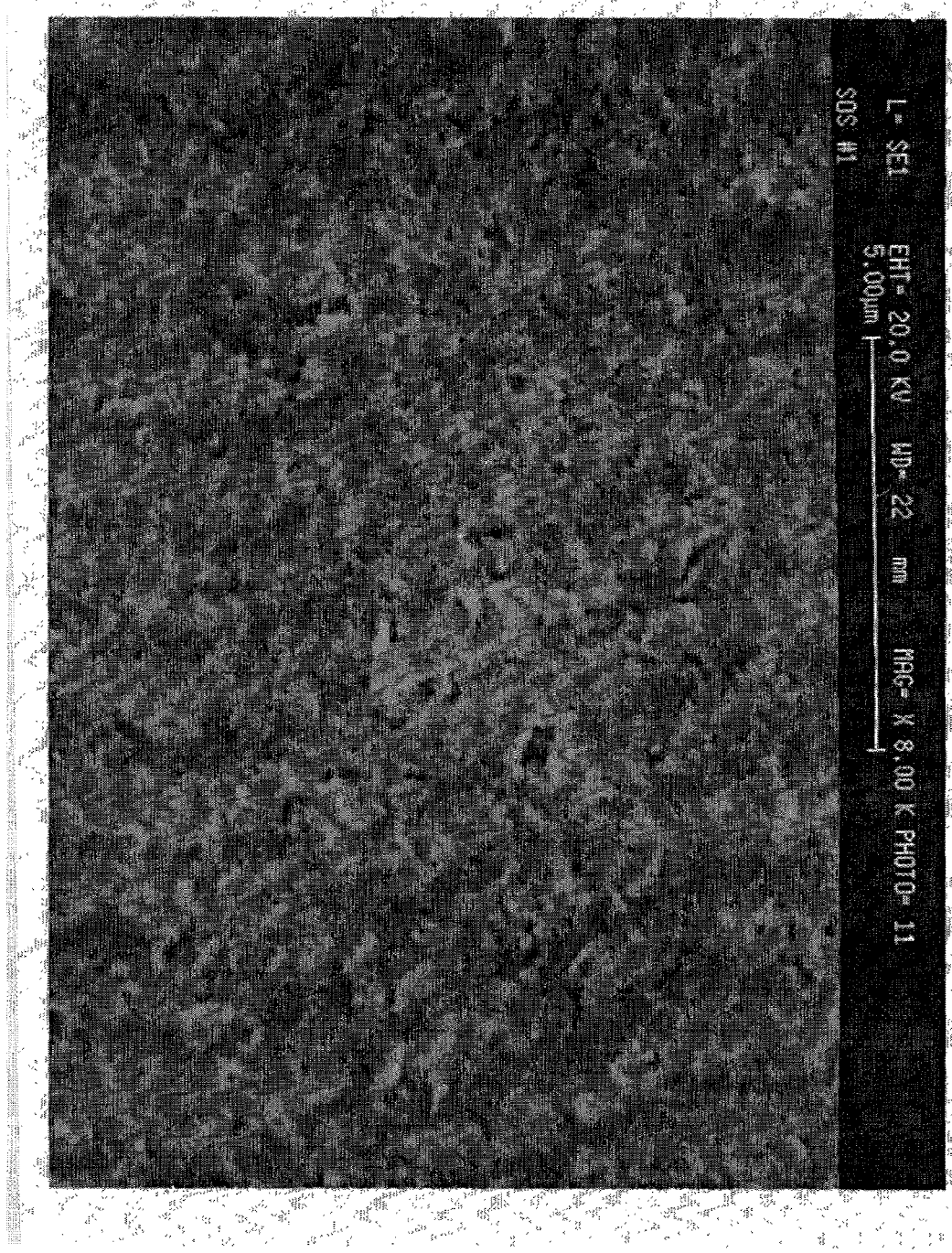
FIG. 6 shows a scanning electron microscope (SEM) photograph showing random porosity obtained by chemical stain etching.

Chemical etching may be done by subjecting the microporous structure to hydrogen fluoride, optionally with hydrochloric acid, nitric acid water and/or ethanol. One useful chemical etching technique employs a 50:50 by volume mixture of 48% hydrofluoric acid and 95% ethanol for from about 15 minutes to about 120 minutes. Chemical vapor etching may be done by subjecting the microporous structure to a vapor of hydrogen fluoride, optionally containing hydrochloric acid, nitric acid or water. One useful technique is employing hydrogen fluoride, nitric acid and water in a 2:1:5 mixture by volume for from about 60 minutes to about 600 minutes. Electrochemical etching may be conducted by subjecting the microporous structure to hydrogen fluoride, optionally containing hydrochloric acid, nitric acid or water. One suitable technique is to electrochemically etch the microporous structure to an etch solution comprising a 1:2:1 ratio by volume of water, ethanol (absolute) and hydrofluoric acid (40%) for from about 10 minutes to about 120 minutes at a current density of from about 0.3 mA/cm$^2$ to about 30 mA/dm$^2$. Chemical stain etching may be done by subjecting the microporous structure to a mixture of 1:5:10 (by volume) of hydrogen fluoride, nitric acid and deionized water for from about 2 minutes to about 40 minutes. FIG. 6 shows a scanning electron microscope (SEM) photograph showing random porosity obtained by chemical stain etching.

The photonic crystal is useful for producing a photonic device which comprises the above produced photonic crystal and electrically conductive, optically transparent layer positioned on opposite surfaces of the photonic crystal. Preferably the electrically conductive, optically transparent layers are electrodeposited on the opposite surfaces of the photonic crystal. Suitable electrically conductive, layers may include metals such aluminum, gold, silver, or. Platinum. A suitable electrically conductive, optically transparent layer comprises indium tin oxide. Such may be produced by electrodepositing electrically conductive, optically transparent material on an opposite sides of the photonic crystal. The photonic device would further comprise an electrode attached to the electrically conductive, optically transparent layers.

Figure 5:
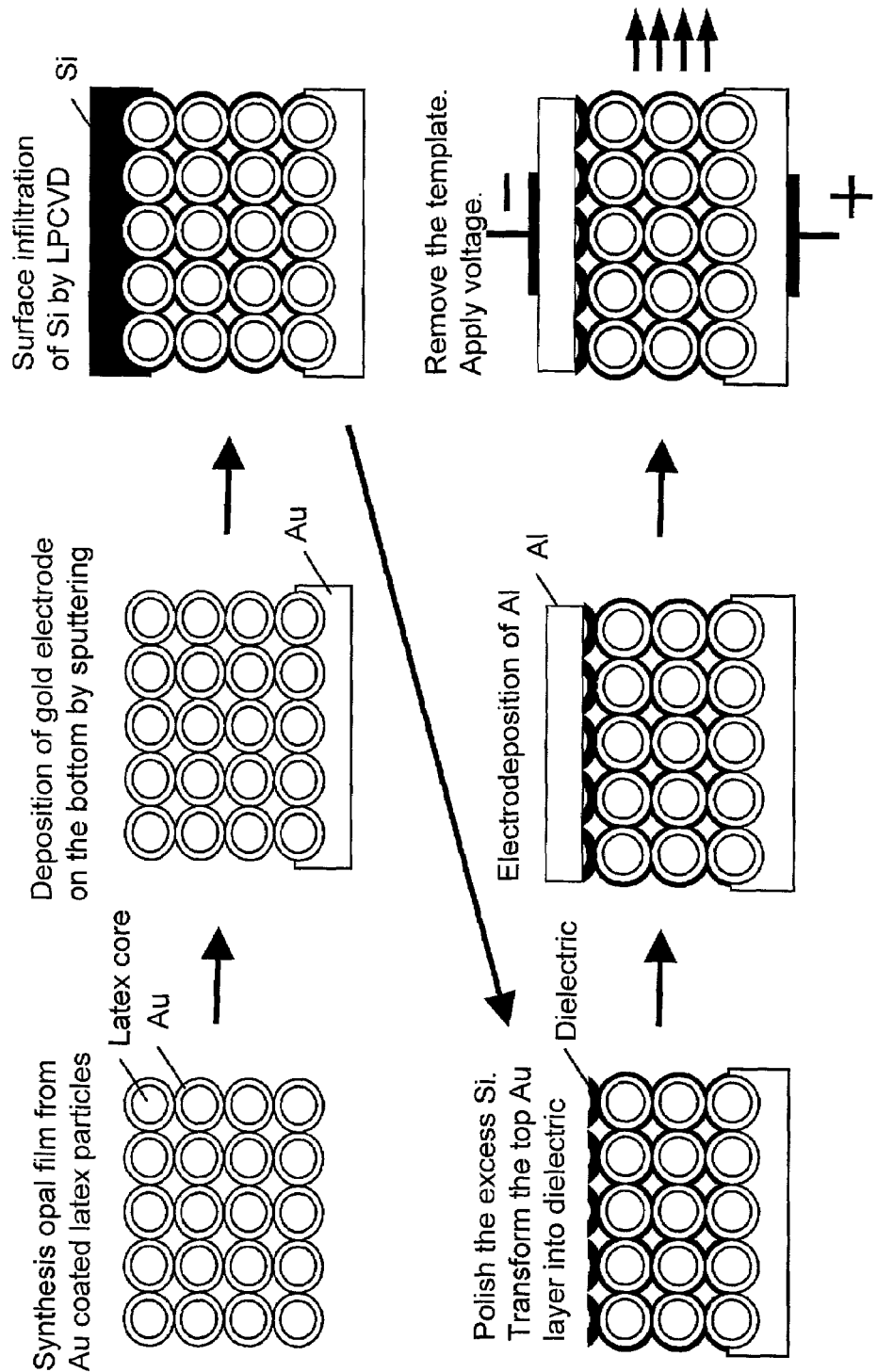
FIG. 5 shows is a schematic representation of a process for forming a photonic device.

Such a device may be used for manufacturing a high luminosity LED, based on two interpenetrating metallic meshes. The processing route is shown schematically in FIG. 5 and is outlined below:

a) Grow an opal film of gold coated latex particles (available commercially from Bang's Laboratories, USA; Micromod, Germany). The thickness of the gold shell can be varied in the range from 0.1 nm to 1 nm.

b) Sinter the opal in order to provide contact between the latex cores of the particles. The obtained interconnected network of gold shells will serve as a high surface area metal electrode, referred to as a metallic mesh. Such a metallic mesh will be transparent due to the lower number of free electrons, which in turn results in a shift of the plasmon frequency from the UV to the IR.

c) Deposit gold electrode on the lower side of the opal sample by sputtering or combine these two steps by growing the opal film on a quartz or sapphire substrate, that has been hydrophilized prior to the formation of wetting suspension film.

d) Surface infiltration of the opal template is done by depositing silicon inside the interparticle space by LPCVD. By adjusting the process parameters, the thickness of the Si coating is kept below 5 nm. Thus the narrowest channels between the tetrahedral and octahedral voids in the opal template will remain open to allow further surface infiltration of a second metallic filler.

e) Remove the excess silicon from the top of the sample by polishing. React the top surface of the gold mesh to transform it into a permanent dielectric. Clean the top surface by plasma etching in order to make the remaining void space accessible for further treatment.

f) A second surface infiltration step is then done by using the gold electrode deposited in step (c) to electrochemically deposit a second metal (electron injector), e.g. aluminum, from the top. As a result a second transparent metallic mesh is formed throughout the opal template.

g) Remove the template by burning the latex core of the spheres. At this stage a nanofoam-type periodic structure is composed of a semiconductor nanofoam sandwiched between two metallic meshes. Make electrical contacts to the gold and aluminum films on both sides of the structure.

The porous double metallic mesh has a number of applications such as for forming a high luminosity LED. By applying a voltage to the structure, ejection of holes and electrons from the two electrodes is induced that will recombine inside the middle semiconductor layer to provide light emitted from the sides. Compared to the current in-plane architecture of the LEDs, the proposed design has a great advantage due to its enormous surface area. Moreover, the structure is a photonic crystal at the same time. By tuning the position of the photonic band gap the frequency of the light emission (electroluminescence) can overlap with the band gap edge. As a result of the photon confinement effects and the very small group velocity at the band edge, a strong nonlinear enhancement of the emitted light or even lasing will occur. The intensity of the emitted light could be additionally increased by deposition of a dielectric mirror on one side of the sample. The photonic crystals can also be made tunable by changing the periodicity of the crystalline structure. This can be achieved by compressing or expanding the crystalline structure, which in turn changes its volume. This change in unit cell parameter can be accomplished by any of the various well-known methods that result in a change of materials dimension. Other examples are the application of an electric field for an electrostrictive or piezoelectric material; a temperature or pressure change for either a shape memory material; the electrically-induced change in dimensions; or a thermally-induced change. Depending on the choice of materials and operating conditions, these changes can be either reversible or irreversible, and can include the effects of refractive index change. For example, if transparent non-constraining electrodes are deposited on opposite sides of the flat plates and an electrical voltage is applied, the material will shrink. This electrically-induced shrinkage causes a change because of a shift in the Bragg diffraction of the inverse opal. The photonic crystals are tunable or otherwise controlled to a desired wavelength by alternately compressing and expanding the crystalline structure, for example by means of a piezoelectric arrangement attached to the crystalline structure. The compressed crystalline structure will reflect a different wavelength than an uncompressed structure. The wavelength of choice may be tuned by the degree of compression or expansion. This may be done by clamping a piezoelectric material onto the crystalline structure and applying a voltage to the piezoelectric material via suitable electrodes. Alternatively, a liquid crystal material may be imbibed on the crystalline structure forming a modified crystalline structure which is capable of splitting an input broadband wavelength into wavelength components via a filtering effect. The composite of the liquid crystal material and the crystalline structure forms a modified crystalline structure which changes it refractive index when a voltage is applied to it via appropriate electrodes. The photonic crystal may also be employed as part of a photonic device by positioning a light emitter positioned to direct light onto the photonic crystal. Preferably the light emitter is capable of transmitting light having a wavelength in the range of from about 1300 to about 1600 nm.

The following non-limiting examples serve to illustrate the invention.

EXAMPLE 1

Production of Micropores. A smooth sapphire substrate is positioned on the bottom of a teflon coated aluminum cup partially filled with water. Microscopic spheres of silicon dioxide average diameter of about 200 nm are slowly added to the cup. The water is drained from the bottom of the cup leaving a face centered cubic structure of about 50 layers of spheres. The spheres are sintered by heating at 650° C. for five hours causing an attaching of adjacent spheres to one another by an intermediate neck thus forming a sintered porous opal.

A sheet of this opal having a thickness of 0.01 mm, a length of 60 mm, and a wide of 20 mm is placed into the CVD chamber and evacuated to $10^{-3}$ mtorr. Then a precursor gas composed of 97% nitrogen and 3% silane ($SiH_4$) is introduced into the CVD chamber. This precursor gas is delivered with the rate 100 sccm per minute in order to maintain the pressure 400 mtorr. The temperature is maintained at 500° C. and held at this temperature for 24 hours. Examination of the surface of this opal sheet shows that the silicon has deposited throughout the opal sample. SEM micrographs, FIGS. 1–4, show that this deposited silicon is in the form of closely spaced, non-percolated particles within the opal void spaces. The solid silicon structure fills about 26% of the total volume between the spheres. The $SiO_2$ spheres are removed from this sample by dissolution in hydrofluoric acid (48%) for three hours. The $SiO_2$-free sample is then thoroughly washed with water and then dried over anhydrous $CaSO_4$ for one hour under vacuum. Scanning electron microscopy (SEM) investigation of a surface of this inverse opal indicates that all silica spheres are dissolved by the hydrofluoric acid. The SEM reveals a periodically arranged and interconnected structure that reliably replicates the void space in the original $SiO_2$ opal.

EXAMPLE 2

Production of Micropores. A monolayer of spheres is formed by loading a concave glass cell with a dilute silica suspension (~1 wt. % solids). After drying, this procedure is repeated several times with the same amount of dilute silica suspension to obtain an ordered film at the center of the cell comprising about 20 layers of silicon spheres. The spheres are sintered by heating a 650° C. for five hours causing an attaching of adjacent spheres to one another by an intermediate neck thus forming a sintered porous opal. A sample of this opal is placed into the CVD chamber and evacuated to $10^{-3}$ mtorr. A precursor gas composed of 97% nitrogen and 3% silane ($SiH_4$) is introduced into the CVD chamber. This precursor gas is delivered at a rate of 100 sccm per minute in order to maintain the pressure 400 mtorr. The temperature is maintained at 500° C. and held at this temperature for 36 hours. Examination of the surface of this opal sheet shows that the silicon is deposited throughout the opal sample. SEM micrographs show that this deposited silicon is in the form of closely spaced, non-percolated particles within the opal void spaces. The solid silicon structure fills about 26% of the total volume between the spheres. The $SiO_2$ spheres are moved from this sample by etching of the silica nanospheres in buffered hydrofluoric acid (BHF). This is done by first etching a small hole in the silicon and immersing in BHF. The $SiO_2$-free sample is then thoroughly washed with water and then dried over anhydrous $CaSO_4$ for one hour under vacuum. Scanning electron microscopy (SEM) investigation of a surface of this inverse opal indicates that all silica spheres are dissolved by the hydrofluoric acid. The SEM reveals a periodically arranged and interconnected structure that reliably replicates the void space in the original $SiO_2$ opal. This may be seen in FIGS. 1–4.

EXAMPLE 4

A photonic crystal having randomly nanoporous surface porosity is prepared by etching the microporous structure obtained from Example 1 with a 1:5:10 (by volume) or 4:1:5 (by volume) mixture of: HF (49%): $HNO_3$ (70%): $H_2O$ (deionized). The first step in the process of creating nanoporosity involves the cleaning of the microporous sample by ultrasonication in pure ethanol. The chemical etching itself is done at room temperature (25° C.) for 5–15 minutes. After the completion of the chemical etching, the sample is rinsed in deionized water for about 5 minutes and dried using pure nitrogen. The samples are then inspected under the photoluminescence test equipment. The photoluminescence testing involves illuminating the photonic crystal sample (that now has micro and random porosity) with light of 365 nm wavelength, using an UV lamp. During the illumination process the samples are viewed under a microscope. A bright red color (corresponding to photoluminescence) is observed under the microscope. The photoluminescence from the samples can be imaged using a Nikon 950 digital camera.

EXAMPLE 5

A photonic crystal having randomly nanoporous surface porosity is prepared by etching the microporous structure obtained from Example 2 with HF vapor until randomly nanoporous surface porosity is obtained, which nanopores having an average pore diameter less than about 10 nm.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A light emitting or light transmitting photonic crystal which comprises a two dimensionally periodic or three dimensionally periodic microporous structural matrix of interconnecting, crystallographically oriented, monodispersed members having voids between adjacent members, and said members additionally having randomly nanoporous surface porosity and which photonic crystal has a photoluminescence property.

2. The photonic crystal of claim 1 wherein the members comprise spheres.

3. The photonic crystal of claim 1 wherein the members comprise spheres and the average sphere diameter does not exceed about 1000 nm.

4. The photonic crystal of claim 1 wherein the members comprise surfaces or interfaces that are inverse replicas of the surfaces of a monodispersed sphere array, wherein necks exists between neighboring spheres in said sphere array and the average sphere diameter does not exceed about 1000 nm.

5. The photonic crystal of claim 1 wherein the nanoporous surface porosity comprises nanopores having an average pore diameter which is less than about 10 nm.

6. The photonic crystal of claim 1 wherein the members comprise a semiconductor material.

7. The photonic crystal of claim 1 wherein the members comprise silicon.

8. The photonic crystal of claim 1 wherein the members comprise polysilicon.

9. The photonic crystal of claim 1 wherein the members comprise p type or n type doped silicon.

10. The photonic crystal of claim 1 wherein the members comprise p type or n type doped polysilicon.

11. A structure comprising the light emitting or light transmitting photonic crystal of claim 1 positioned on a surface of a substrate.

12. The structure of claim 11 wherein the substrate comprises a material selected from the group consisting of glass, quartz, borosilicate glass, silicon, sapphire and combinations thereof.

13. The structure of claim 11 wherein the substrate comprises sapphire.

14. The structure of claim 11 wherein the substrate comprises sapphire, which substrate is substantially flat, hydrophilic, HF resistant, optically transparent, and resistant to heat elongation in any direction at temperatures of up to about 800° C.

15. The structure of claim 11 further comprising a device for alternately compressing and expanding the photonic crystal.

16. The structure of claim 11 further comprising a piezoelectric device for alternately compressing and expanding the photonic crystal.

17. The structure of claim 11 further comprising a liquid crystal material that is imbibed on the photonic crystal.

18. A photonic device which comprises a light emitting or light transmitting photonic crystal which comprises a two dimensionally periodic or three dimensionally periodic microporous structural matrix of interconnecting, crystallographically oriented, monodispersed members having voids between adjacent members, and said members additionally having randomly nanoporous surface porosity; and an electrically conductive, optically transparent layer positioned on opposite surfaces of the photonic crystal, and which photonic crystal has a photoluminescence property.

19. The photonic device of claim 18 wherein the electrically conductive, optically transparent layers are electrodeposited on the opposite surfaces of the photonic crystal.

20. The photonic device of claim 18 further comprising an electrode attached to the electrically conductive, optically transparent layers.

21. The photonic device of claim 18 further comprising a light emitter positioned to direct light onto the photonic crystal.

22. The photonic device of claim 18 further comprising a light emitter positioned to direct light onto the photonic crystal which is capable of transmitting light having a wavelength in the range of from about 1300 to about 1600 nm.

23. A process for forming a light emitting or light transmitting photonic crystal which comprises forming a two dimensionally periodic or three dimensionally periodic microporous structural matrix of interconnecting, crystallographically oriented, monodispersed members having voids between adjacent members, and then providing surfaces of said members with randomly nanoporous surface porosity and which photonic crystal has a photoluminescence property.

24. The process of claim 23 wherein the members comprise spheres.

25. The process of claim 23 wherein the members comprise spheres and the average sphere diameter does not exceed about 1000 nm.

26. The process of 23 wherein the members comprise surfaces or interfaces that are inverse replicas of the surfaces of a monodispersed sphere array, wherein necks exists between neighboring spheres in said sphere array and the average sphere diameter does not exceed about 1000 nm.

27. The process of claim 23 wherein the nanoporous surface porosity comprises nanopores having an average pore diameter which is less than about 10 nm.

28. The process of claim 23 wherein the members comprise a semiconductor material.

29. The process of claim 23 wherein the members comprise silicon.

30. The process of claim 23 wherein the members comprise polysilicon.

31. The process of claim 23 wherein the members comprise p type or n type doped silicon.

32. The process of claim 23 wherein the members comprise p type or n type doped polysilicon.

33. The process of claim 23 wherein the members are provided with randomly nanoporous surface porosity by chemical vapor etching, electrochemical etching or chemical stain etching.

34. The process of claim 23 wherein the members comprise silicon or polysilicon and the members are provided with randomly nanoporous surface porosity by chemical etching or electrochemical etching in an ethanolic HF solution.

35. The process of claim 23 wherein the photonic crystal is positioned on a surface of a substrate.

36. The process of claim 23 wherein the substrate comprises a material selected from the group consisting of glass, quartz, borosilicate glass, silicon, sapphire and combinations thereof.

37. The process of claim 23 further comprising contacting the photonic crystal with a device for alternately compressing and expanding the photonic crystal.

38. The process of claim 23 further comprising contacting the photonic crystal with a piezoelectric device for alternately compressing and expanding the photonic crystal.

39. The process of claim 23 further comprising imbibing a liquid crystal material on the photonic crystal.

* * * * *